(12) United States Patent
Wan

(10) Patent No.: US 8,773,199 B2
(45) Date of Patent: Jul. 8, 2014

(54) COMPENSATION TECHNIQUE FOR FEEDBACK AMPLIFIERS

(71) Applicant: Analog Devices, Inc., Norwood, MA (US)

(72) Inventor: Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 27 days.

(21) Appl. No.: 13/627,117

(22) Filed: Sep. 26, 2012

(65) Prior Publication Data

US 2013/0293304 A1 Nov. 7, 2013

Related U.S. Application Data

(63) Continuation-in-part of application No. 13/464,311, filed on May 4, 2012.

(51) Int. Cl.
*H03F 1/34* (2006.01)

(52) U.S. Cl.
USPC .......................................... 330/103; 330/100

(58) Field of Classification Search
USPC ............ 330/98–100, 103, 107, 109, 292, 294
See application file for complete search history.

(56) References Cited

U.S. PATENT DOCUMENTS

| | | |
|---|---|---|
| 3,918,005 A | 11/1975 | Bruckenstein et al. |
| 6,731,165 B1 | 5/2004 | Marz |
| 7,002,409 B1 | 2/2006 | Aram |
| 7,173,486 B1 | 2/2007 | Sutardja |
| 7,696,820 B1 * | 4/2010 | Voo .............................. 330/109 |
| 2003/0169104 A1 | 9/2003 | Huckins et al. |
| 2006/0202753 A1 | 9/2006 | Ferianz et al. |
| 2008/0186091 A1 | 8/2008 | Corsi |

FOREIGN PATENT DOCUMENTS

WO    WO 01/35526 A2    5/2001

OTHER PUBLICATIONS

International Search Report and Written Opinion for PCT/US2013/039195, Aug. 16, 2013, 13 pages.

* cited by examiner

*Primary Examiner* — Steven J Mottola
(74) *Attorney, Agent, or Firm* — Knobbe, Martens, Olson & Bear, LLP

(57) ABSTRACT

Compensation methods and systems for voltage-feedback amplifiers provide improved dynamic performance (i.e., increased bandwidth and the elimination or alleviation of a slew limitation) at various gains by self-adaptively changing the Miller effect with respect to the gain setting.

22 Claims, 14 Drawing Sheets

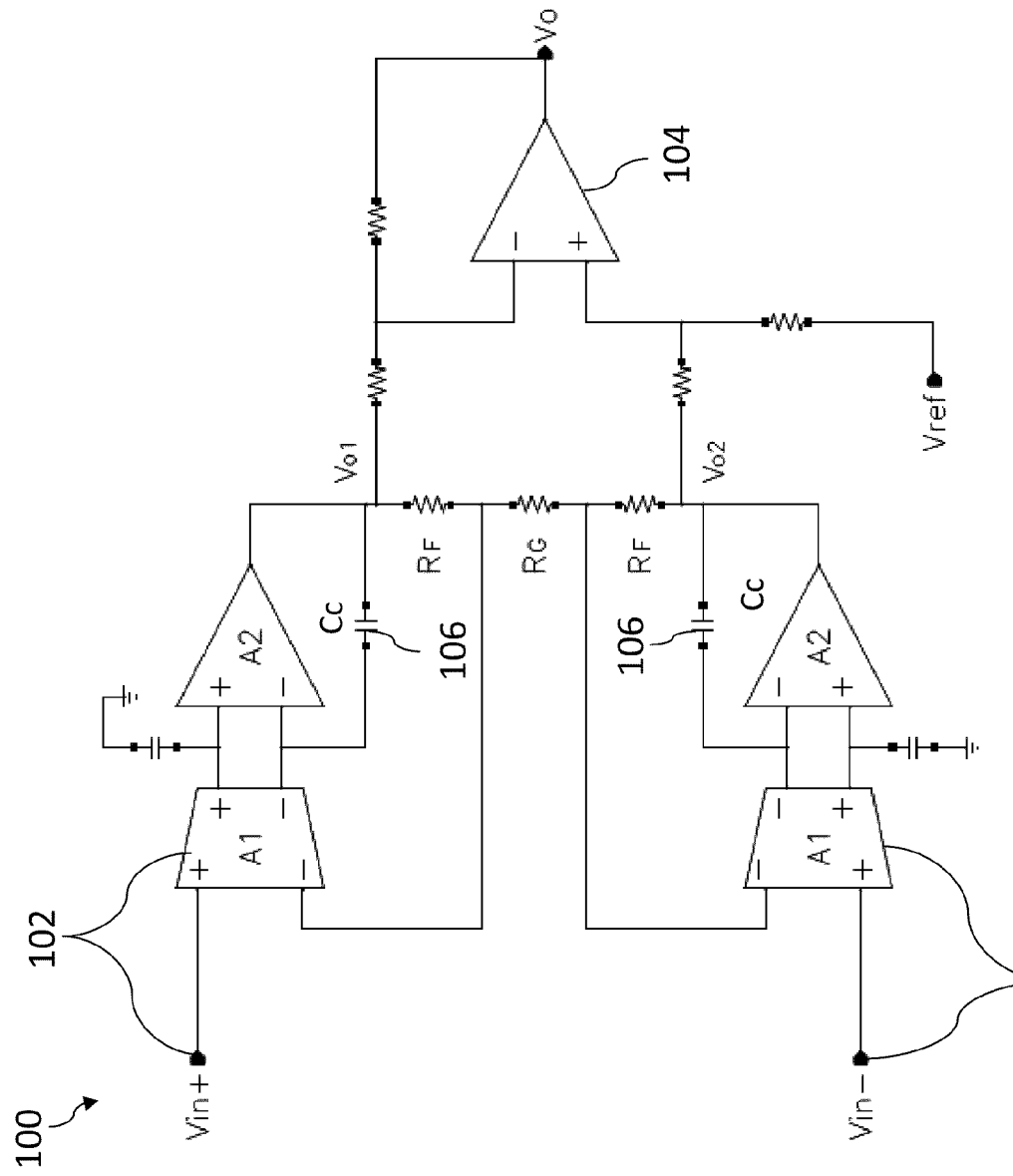
FIG. 1 – Prior Art

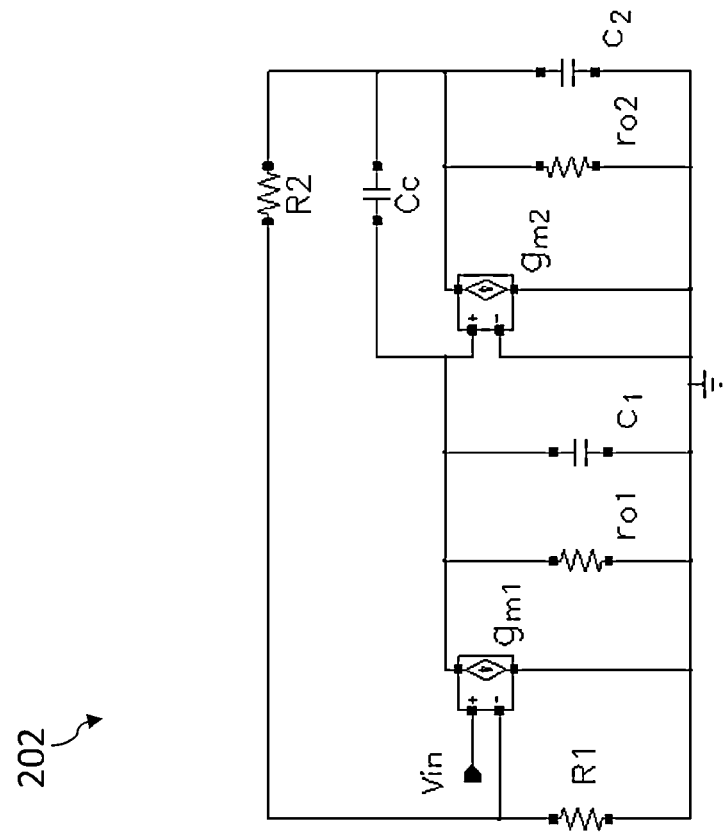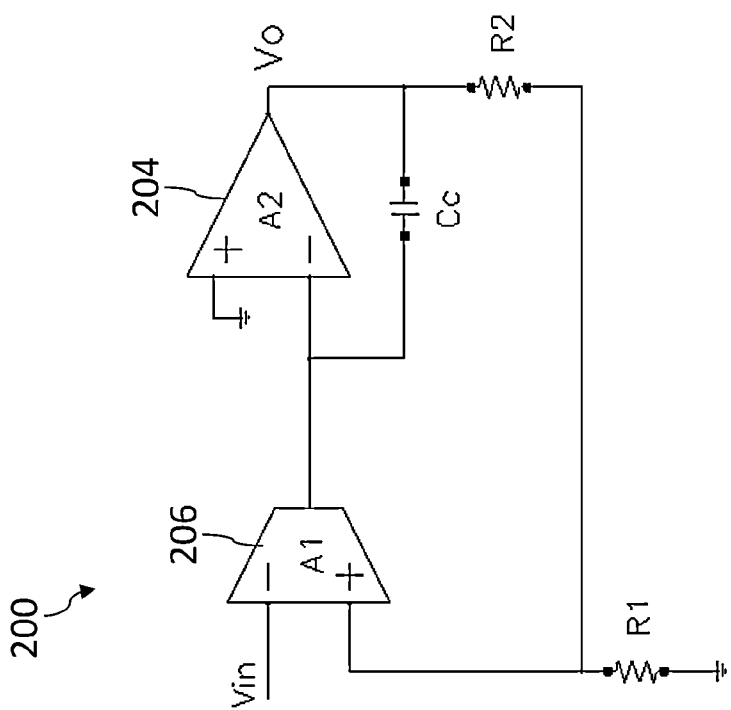
FIG. 2 – Prior Art

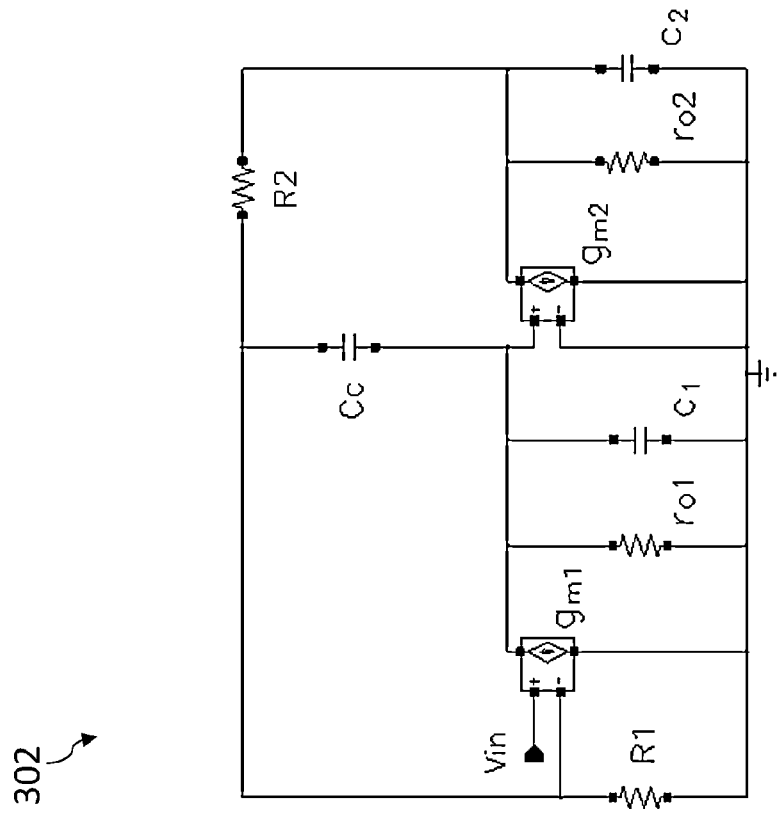
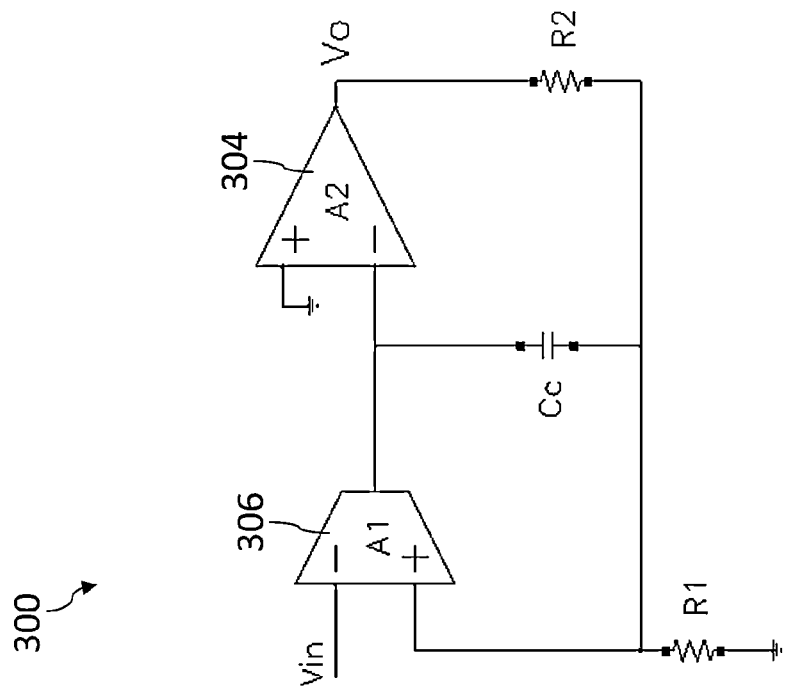
FIG. 3

| $R_F$ | Gain | $R_G$ | $A_2$ | β | BW | BW* | BW* ÷ BW |
|---|---|---|---|---|---|---|---|
| 50K | 1 | ∞ | 100 | 1 | 100K | 100K | 1 |
| 50K | 2 | 100K | 100 | 0.5 | 50K | 99K | 2 |
| 50K | 5 | 25K | 100 | 0.2 | 20K | 96K | 5 |
| 50K | 10 | 11.1K | 100 | 0.1 | 10K | 92K | 9 |
| 50K | 20 | 5.26K | 100 | 0.05 | 5K | 84K | 17 |
| 50K | 50 | 2.04K | 100 | 0.02 | 2K | 67K | 34 |
| 50K | 100 | 1.01K | 100 | 0.01 | 1K | 50.5K | 51 |
| 50K | 200 | 502.5 | 100 | 0.005 | 500 | 33.7K | 67 |
| 50K | 500 | 200.4 | 100 | 0.002 | 200 | 16.8K | 84 |
| 50K | 1000 | 100.1 | 100 | 0.001 | 100 | 9K | 92 |

COMPENSATION TECHNIQUE FOR FEEDBACK AMPLIFIERS

CROSS-REFERENCE TO RELATED APPLICATIONS

This application is a continuation-in-part of and claims priority to and the benefit of U.S. patent application Ser. No. 13/464,311, filed on May 4, 2012, which is hereby incorporated herein by reference in its entirety.

TECHNICAL FIELD

Embodiments of the current invention related to amplifier circuits and, more particularly, to voltage feedback amplifiers.

BACKGROUND

The dynamic performance of a voltage feedback amplifier (i.e., its ability to accurately amplify time-varying signals) is limited by its open-loop unity gain bandwidth or gain-bandwidth product ("GBW") and slew rate. Because the GBW of an amplifier is constant, the closed-loop bandwidth is inversely proportional to its gain; if a given amplifier is configured for a high gain, for example, its bandwidth correspondingly drops (sometimes dramatically). This drop in bandwidth may degrade the amplifier's performance, especially with high-frequency inputs. Some amplifiers (such as general-purpose instrumentation amplifiers) include an input ports (e.g., pins on a chip package) to which a customizable gain-setting resistor ("$R_G$") may be connected. A user may therefore select a desired gain value by varying the size of $R_G$ but, in doing so, deleteriously change the amplifier's bandwidth. FIG. 1 illustrates an exemplary three operational-amplifier ("op-amp") instrumentation amplifier 100 that includes input amplifiers 102 (divided into first-stage $A_1$ and second-stage $A_2$ amplifiers) and an output amplifier 104. Because the output amplifier 104 is configured to have a gain of one, its closed-loop bandwidth is fixed at approximately half of its unit-gain bandwidth, regardless of the gain settings of the entire amplifier 100. Therefore, the bandwidth of the amplifier 100 is usually limited by the bandwidth of the input amplifier 102. For example, assuming the input amplifier 102 has a unit-gain bandwidth of 100 kHz, at a gain of 1000, the closed-loop 3 dB bandwidth (i.e., cutoff frequency) of the amplifier 100 is reduced to 100 Hz (because, as noted above, its GBW is fixed, and 100 kHz÷1000=100 Hz).

If the gain is set to a high value, the resulting low bandwidth of the amplifier 100 may be increased by configuring other components in the circuit. For example, part of the amplifier's compensation capacitance 106 may be switched out (i.e., electrically disconnected from the circuit) to increase its open loop unity gain bandwidth (and, as a result, its closed loop bandwidth as well) thereby improving the high-frequency performance of the circuit. This adjustment, however, requires additional input ports for the control signals necessary to change the compensation capacitance 106; in the simplest case, one pin may be used to switch part of the capacitance 106 in or out, but more pins are required for finer-grained control. Many amplifiers, such as commercial general-purpose resistor-programmable instrumentation amplifiers, cannot provide these additional ports because they would increase the cost of the amplifier, the complexity of the control circuitry, and/or the size of the amplifier package. A current-feedback amplifier may be used for high-speed operation, because its dynamic performance is not limited by GBW and slew rate, but these amplifiers have lower DC gain and are thus not suitable for high-precision applications. A need therefore exists for a way of boosting the bandwidth of a voltage-feedback amplifier at high gains without requiring additional input ports.

SUMMARY

In general, a closed-loop gain of a voltage feedback circuit may be set by a resistor network composed of two resistors, $R_1$ and $R_2$. In a non-inverting configuration, $R_1$ may be connected between an inverting input node of the amplifier and a ground or virtual ground node. In an inverting configuration, $R_1$ may be connected between the inverting input node and a signal source. In both cases, $R_2$ is a feedback resistor connected between the output of the amplifier and the inverting input node of the amplifier, therefore forming a first feedback path between the output node and the inverting input node. In existing circuits, a second feedback path is formed using a capacitor connected between an intermediate node and output node of the amplifier, thereby providing fixed Miller compensation, as discussed above. This configuration sets the GBW of the amplifier for stability consideration, but it may also limit the slew rate and closed loop bandwidth of the amplifier.

The compensation technique of the present invention extends the small-signal bandwidth of an amplifier while also eliminating/alleviating its slew limitation under a large-signal step response. In various embodiments, the second feedback path between the output node and intermediate node includes a capacitor and some series resistance $R_X$ incorporated from the resistor network $R_1$ and $R_2$. $R_X$ may be composed of part of $R_2$, entire $R_2$, or entire $R_2$ and part of $R_1$. The second feedback path between the intermediate node and the output node of the amplifier provides adaptive Miller compensation. The second feedback path shares some resistance with the gain-setting network $R_1$ and $R_2$, which causes the Miller effect to depend on the closed loop gain setting. The Miller effect of the compensation capacitor is therefore adaptively changed with respect to the closed-loop gain, thus effectively increasing the equivalent open loop unity gain bandwidth or GBW of amplifiers. Thus, the closed-loop bandwidth of feedback amplifiers is also increased accordingly.

In one aspect, a system for extending a bandwidth and improving slew behavior of a feedback amplifier includes an amplifier having an input node, an output node, and an intermediate node; a first feedback path between the input node and output node; and a second feedback path between the intermediate node and output node. The first feedback path shares at least a portion of the second feedback path. The first path and the second path may share a feedback resistor, and the second path may include a compensation capacitor that is not shared with the first feedback path.

The first feedback path may include a feedback resistor split into two parts, and the second feedback path may share one of the two parts of the feedback resistor of the first path. A resistor may be connected between an input node of the amplifier and a ground and may be split into two parts; the second feedback path may include one of the two parts. The amplifier may be a multiple-stage amplifier. A closed-loop 3 dB bandwidth of the amplifier may remain approximately constant at its unit-gain bandwidth regardless of a gain setting of the amplifier. A closed-loop 3 dB bandwidth may be extended by a factor of $$\frac{1+A_2}{1+A_2\beta},$$

wherein β is the feedback coefficient and $A_2$ is the gain between the intermediate node and output node.

A second amplifier for amplifying and/or buffering the voltage on the output node may be included. A gain-setting resistor may be included; the signal derived from the output voltage and the closed loop gain of the amplifier may depend on the ratio of the gain-setting resistor and the feedback resistor. The amplifier and the second amplifier may include an instrumentation amplifier. The second amplifier may be a unity gain amplifier, a differential amplifier, and/or an operational amplifier. The amplifier may include a first stage for amplifying an input voltage on the input node to produce the intermediate voltage on the intermediate node and a second stage for amplifying the intermediate voltage to produce the output voltage.

In another aspect, a method for extending a bandwidth of a feedback amplifier includes providing a first signal derived from an output voltage of an amplifier to an input node of the amplifier and providing a second signal derived from the output voltage of an amplifier to an intermediate node of the amplifier. The second signal increases a bandwidth of the feedback amplifier as a gain of the amplifier increases.

Providing the first signal may include sharing an entire feedback resistor with the second signal and/or sharing a portion feedback resistor with the second signal. A high input impedance may be provided in a first amplifier and a unity gain may be provided in a second amplifier. A gain of the feedback amplifier may be adjusted; adjusting the gain may include adjusting a resistance of a gain-setting resistor.

In another aspect, a system for extending a bandwidth and improving slew behavior of a feedback amplifier includes an amplifier having an input node, an output node, and an intermediate node; a first feedback path for providing, to the input node, a signal derived from an output voltage on the output node; and a second feedback path for providing, to the intermediate node, a signal derived from an output voltage on the output node. The second feedback path may include a compensation capacitor. A closed-loop 3 dB bandwidth of the amplifier may remain approximately constant at its unit-gain bandwidth regardless of a gain setting of the amplifier.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which:

FIG. 1 illustrates a three op-amp instrumentation amplifier with typical non-inverting feedback amplifiers as a input stage as known in the prior art;

FIG. 2 illustrates a typical non-inverting feedback amplifier and its small-signal model as known in the prior art;

FIG. 3 illustrates a non-inverting feedback amplifier and its small-signal model in accordance with an embodiment of the invention;

FIG. 5 is a table of example bandwidth values in accordance with an embodiment of the invention;

DETAILED DESCRIPTION

Figure 4:
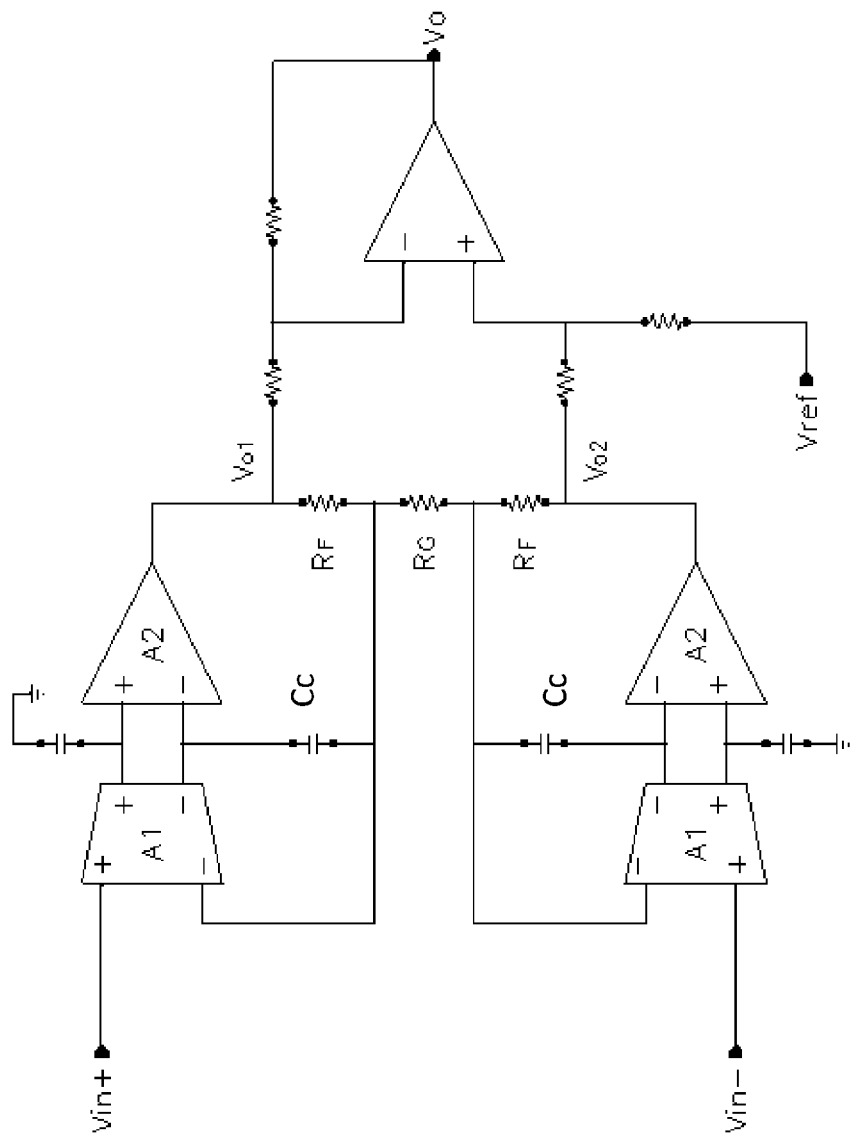
FIG. 4 illustrates an exemplary instrumentation amplifier with non-inverting feedback amplifiers in accordance with an embodiment of the invention as a input stage.

In various embodiments, the Miller effect of a compensation capacitor of a feedback circuit is adaptively changed with respect to the closed-loop gain of the circuit. More specifically, at high gain, the Miller effect is reduced; at lower gain, the Miller effect is increased. In one embodiment, a compensation capacitance $C_C$ is connected between an intermediate node of the amplifier and an inverting input of the amplifier. The second feedback path between the output and intermediate node of the amplifier is formed by $R_2$ and $C_C$. In another embodiment, the resistor $R_2$ may be split into two parts, $R_{2A}$ and $R_{2B}$, and $C_C$ may be connected between an intermediate node of the amplifier and an intermediate node of the resistor $R_2$. The second feedback path between the output and intermediate node of the amplifier is formed by $R_{2A}$ and $C_C$. In another embodiment, the resistor $R_1$ may be split into two parts, $R_{1A}$ and $R_{1B}$, and $C_C$ may be connected between an intermediate node of the amplifier and an intermediate node of the resistor $R_1$. The second feedback path between the output and intermediate node of the amplifier is formed by $R_2$, $R_{1A}$, and $C_C$. One of skill in the art will understand that the same principle may be applied to other kinds of (e.g., multiple-stage) amplifiers.

In one embodiment, a system for extending the bandwidth and improving slew behavior of a feedback amplifier includes an amplifier and first and second feedback paths. The amplifier has an input node, an output node, and an intermediate node (e.g., an internal node between amplifier stages). The first feedback path may be formed using a resistor $R_2$ connected between the output node and the input node. The amount of signal feedback from the output node to the inverting input of the amplifier is set by the resistor network $R_1$ and $R_2$; more specifically, the feedback coefficient of the first feedback path is given by the expression $$\frac{R_1}{R_1 + R_2}.$$

The closed loop gain of the amplifier is $$\frac{R_1 + R_2}{R_1}$$

when the amplifier is under non-inverting configuration or $$-\frac{R_2}{R_1}$$

when the amplifier is under inverting configuration.

The second feedback path may be made between the output node and the intermediate node of the amplifier through the compensation capacitor $C_C$ and one or more resistor(s) $R_X$, where $R_X$ may be composed of $R_{2A}$, $R_{2B}$, $R_2$ and $R_{1A}$, and/or other combinations thereof. The second feedback path functions as an adaptive Miller comnensation circuit. The Miller effect is adjusted by approximately a factor of $$1 - \frac{R_X}{R_1 + R_2}.$$

Therefore, the Miller effect is approximately inversely proportional to the closed loop gain. This self-adaptive Miller compensation effectively extends the closed loop bandwidth. The second feedback path may further include an amplifier or voltage buffer $A_3$ or a resistor $A_Z$ to cancel the forward zero in the second path.

In the case where $R_X$ is composed of $R_2$, the closed-loop 3 dB bandwidth of the amplifier may be increased by a factor of $$\frac{1 + A_2}{1 + A_2 \beta}$$

(wherein $\beta$ is the feedback coefficient of the first feedback path and $A_2$ is the gain between the intermediate node and output node). For a noise and bandwidth tradeoff, $R_2$ may be split into two parts; in this case, $R_X$ comprises only part of $R_2$, represented as the value $R_{2A}$. Thus, the bandwidth may be increased at a factor of $$\frac{1 + A_2}{1 + \left(1 + \frac{R_{2B}}{R_1}\right) A_2 \beta}.$$

If higher bandwidth is desirable, $R_1$ may be split into two parts, and Rx may be composed of $R_2$ and part of $R_1$, represented by the value $R_{1A}$, thus the bandwidth may be increased by a factor of $$\frac{1 + A_2}{1 + \frac{R_{1B}}{R_{1A} + R_{1B}} A_2 \beta}.$$

FIG. 2 illustrates a schematic 200 and small-signal model 202 of a non-inverting voltage feedback amplifier as known in the prior art; FIG. 3 illustrates a schematic 300 and small-signal model 302 of a non-inverting voltage feedback amplifier having an improved compensation scheme. Both amplifiers 200, 300 have a single-ended first stage, but one of skill in the art will understand that the discussion herein may also apply to a differential first stage, and, further, to any voltage feedback amplifiers configured using either non-inverting operation or inverting operation (such as, for example, an input amplifier of a three operational-amplifier instrumentation amplifier). A single output stage 204, 304 is shown; the current invention is not, however, limited to any particular number of amplification and/or output stages. Because the output stage reverses signal polarity, the inverting and non-inverting inputs nodes of the first stage 206, 306 correspond to the non-inverting and inverting input nodes of the feedback amplifier, respectively.

In both FIG. 2 and FIG. 3, the closed-loop gain of the voltage feedback is set by a resistor network composed of two resistors: $R_1$ and $R_2$. $R_2$ is a feedback resistor connected between the output $V_o$ and the inverting input node of the amplifier, thereby forming the first feedback path between the output node and the inverting input node. The second feedback path in FIG. 3, however, is different from that in FIG. 2. In FIG. 2, the second feedback path includes a capacitor $C_C$ connected between an intermediate node and the output node of the amplifier to thereby provide the Miller compensation for the amplifier. The GWB of the amplifier is set by $g_{m1}/C_C$ regardless of the closed-loop gain setting, where $g_{m1}$ is the transconductance of the first stage. In FIG. 3, the second feedback path between the output node and intermediate node of the amplifier includes $R_2$ and $C_C$. The voltage gain across $C_C$ is proportional to $R_1/(R_1+R_2)$; the Miller effect, therefore, is automatically adjusted by the closed-loop gain. Thus, the equivalent open-loop GBW is inversely proportional to $R_1/(R_1+R_2)$, or, in other words, proportional to the closed loop gain $(R_1+R_2)/R_1$. The self-adaptive Miller compensation effectively extends the closed-loop bandwidth of the amplifier at high gain settings.

A rigorous analysis of the benefits of the compensation technique in accordance of this invention follows. For simplicity, the below analysis assumes that the feedback amplifiers do not drive large-value external capacitances, which is a typical case for input amplifiers. It is also assumed that their internal parasitic capacitances (modeled with $c_1$ and $c_2$) are typically much less than the compensation capacitance $C_c$; these other capacitances are therefore omitted. One of skill in the art will understand, however, that these assumptions are used merely to convey the below concepts more clearly and that the present invention may be used in circuits driving large capacitances, having non-negligible internal parasitic capacitance, or deviating from other assumptions inherent in the below equations. As noted above, the loop gain at DC is given by $A_1 A_2 \beta$, as those terms are defined below by Equations (2)-(4), $$A_1 = g_{m1} r_{o1} \quad (2)$$

$$A_2 = g_{m2}[r_{o2} // (R_2 + R_1)] = g_{m2} \frac{r_{o2}(R_2 + R_1)}{r_{o2} + R_2 + R_1} \quad (3)$$

$$\beta = \frac{R_1}{R_2 + R_1} \quad (4)$$

in which $g_{m1}/r_{o1}$ and $g_{m2}/r_{o2}$ are the transconductance/output impedance of the first- and second-stage amplifiers, respectively. The equivalent capacitance produced by the compensation capacitance $C_c$ is, due to the Miller effect, greater than $C_c$ and is given by Equation (5), $$C_{eq} = (1+k)C_c \quad (5)$$

in which k is the voltage gain across the compensation capacitor $C_c$. As one of skill in the art will understand, the Miller effect causes a capacitance at a first terminal of a capacitor to appear larger than it actually is if a voltage at the second terminal of the capacitor is changing in a direction opposite to that of the first terminal. Based on this value of the equivalent capacitance, the transfer function of the loop gain has a dominant pole $f_0$ and a unity gain bandwidth $f_u$ given by Equation (6) and (7), respectively.

$$f_0 = \frac{1}{2\pi r_{o1}(1+k)C_c} \quad (6)$$

$$f_u = A_1 A_2 \beta \cdot f_0 \quad (7)$$

The closed-loop 3 dB bandwidth or cutoff frequency $f_c$ of the feedback amplifier is the same as $f_u$, thus also given by Equation (8).

$$f_c = A_1 A_2 \beta \cdot f_0 \quad (8)$$

For the conventional compensation technique as shown in FIG. 2, k is equal to $A_2$; for the compensation technique of the current invention, as shown in FIG. 3, k is equal to $A_2\beta$ due to the second feedback path providing the additional dependence on $\beta$ (i.e. the voltage gain across the capacitor is now reduced to be $A_2\beta$). Thus, for the conventional compensation technique of FIG. 2, substituting the appropriate values into Equations (6) and (8) yields a dominant pole of the loop gain $f_0$ and a closed-loop 3 dB bandwidth $f_c$ as given by Equations (9) and (10).

$$f_0 = \frac{1}{2\pi r_{o1}(1+A_2)C_c} \quad (9)$$

$$f_c = A_1 A_2 \beta \frac{1}{2\pi r_{o1}(1+A_2)C_c} \quad (10)$$

Because $A_2$ is usually much larger than 1, Equation (10) may be simplified as shown in Equation (11).

$$f_c = A_1 A_2 \beta \frac{1}{2\pi r_{o1} A_2 C_c} = \beta \frac{g_{m1} r_{o1}}{2\pi r_{o1} C_c} = \beta \frac{g_{m1}}{2\pi C_c} \quad (11)$$

Substituting the above value of k for the compensation technique of the current invention into Equations (6) and (8) yields a dominant pole $f_0^*$ and closed-loop 3 dB bandwidth $f_c^*$ as given by Equations (12) and (13).

$$f_0^* = \frac{1}{2\pi r_{o1}(1+A_2\beta)C_c} \quad (12)$$

$$f_c^* = A_1 A_2 \beta \frac{1}{2\pi r_{o1}(1+A_2\beta)C_c} \quad (13)$$

Thus, in each case, although the DC loop gain may be the same, the dominant pole of the loop gain, thus its transfer function is different. Therefore, the closed-loop 3 dB bandwidth also changes. Equation (14), shown below, may thus be derived from Equations (10) and (13).

$$\frac{f_c^*}{f_c} = \frac{1+A_2}{1+A_2\beta} \quad (14)$$

Compared to the existing compensation technique of FIG. 2, the closed-loop 3 dB bandwidth of the amplifier in FIG. 3 is therefore extended by a factor of $$\frac{1+A_2}{1+A_2\beta},$$

as shown above by Equation (14).

Usually, $A_2\beta \gg 1$; the closed-loop 3 dB bandwidth $f_c^*$ may be thus approximated by the expression in Equation (15).

$$f_c^* \cong \frac{A_1 A_2 \beta}{2\pi r_{o1} A_2 \beta C_C} = \frac{g_{m1}}{2\pi C_c} \quad (15)$$

Therefore, the closed loop 3 dB bandwidth of the amplifier remains approximately constant, regardless of the gain setting. Compared to the conventional compensation technique, the bandwidth is extended by approximately a factor of $1/\beta$.

The closed-loop bandwidth may start to drop in the case where $A_2\beta \ll 1$. This may happen if gain setting is very high, so that $\beta$ is very small. The closed-loop 3 dB bandwidth $f_c^*$ may then be approximated by the expression in Equation (16).

$$f_c^* \cong \frac{A_1 A_2 \beta}{2\pi r_{o1} C_c} = A_2 \beta \frac{g_{m1}}{2\pi C_c} \quad (16)$$

Compared to the conventional compensation technique, the closed loop bandwidth is extended by approximately a factor of $A_2$ in this case. At a gain of one, the compensation technique of the present invention provides the widest possible bandwidth of $$\frac{g_{m1}}{2\pi C_c}$$

(in accordance with Equation (14) when $\beta=1$), which is the same as that of a conventional Miller compensation technique (e.g., the technique pictured in FIG. 2). The compensation technique of the current invention therefore extends the bandwidth of the amplifier 200 only if its gain is configured to be higher than one (i.e., gains at which the circuit of FIG. 2 would have reduced bandwidth). Therefore, the bandwidth extension of the present invention does not deteriorate the stability of the amplifier.

Figure 6:
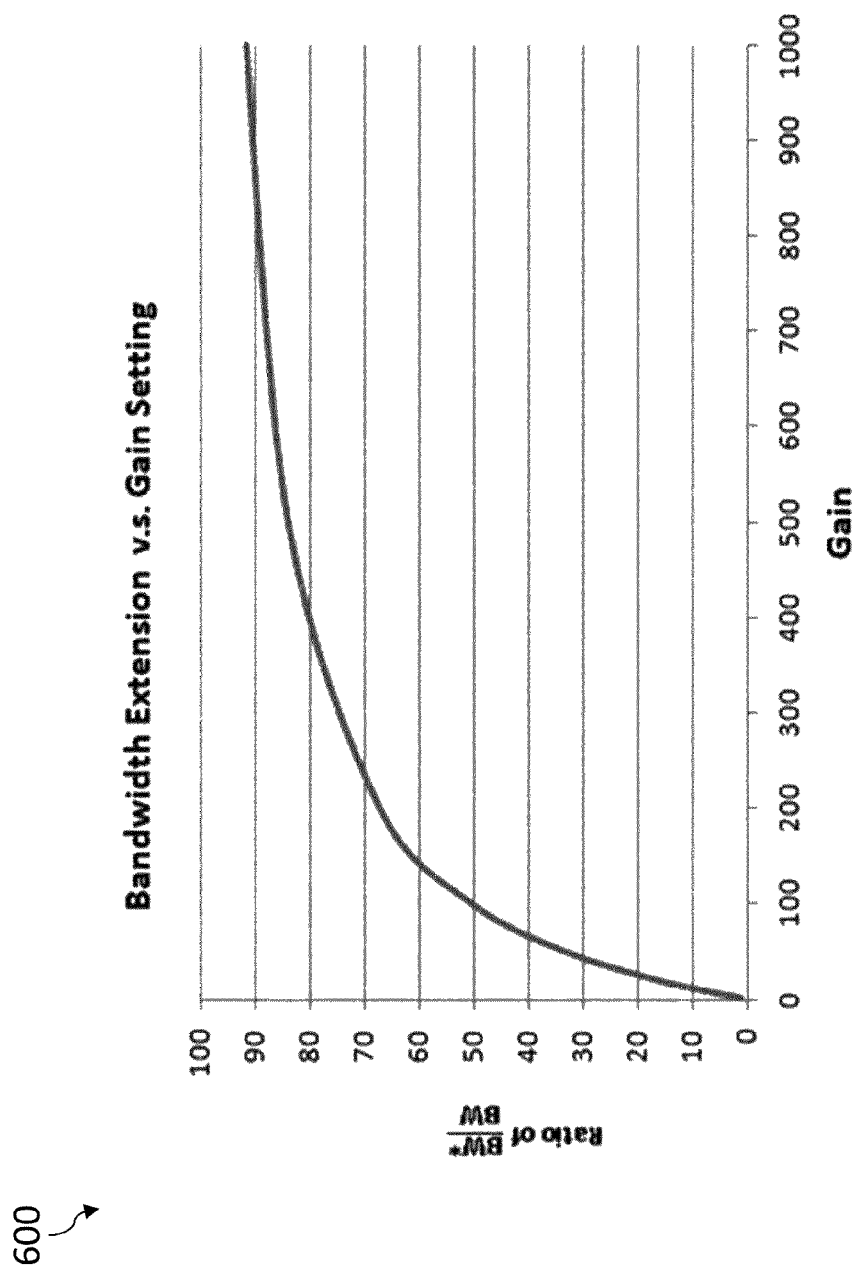
FIG. 6 is a graph of example bandwidth values in accordance with an embodiment of the invention.

FIG. 4 illustrates an exemplary instrumentation amplifier 400 in accordance with an embodiment of the invention. Assuming $R_F$=50 kΩ, $A_2$=100, and GBW=100 kHz, the effect of bandwidth extension under a variety of gain settings is given in the table 500 depicted in FIG. 5. "BW" represents the bandwidth under the conventional Miller compensation technique of FIG. 1, and "BW*" represents the bandwidth under the compensation technique of the present invention. As shown, when gain=1, the new bandwidth BW* does not differ from the old bandwidth BW, but as gain increases, BW falls off much more quickly than BW*. The ratio of BW* to BW is shown in a graph 600 appearing in FIG. 6.

The compensation technique of the present invention thus improves an amplifier's dynamic performance in at least two aspects. First, the amplifier 300 of FIG. 3 has a wider small-signal bandwidth than the existing amplifiers 100, 200 of FIG. 1 and FIG. 2 (as discussed above). Second, it eliminates, or at least alleviates, slew limitation during a large signal step response (in other words, the rate at which the output voltage can change in response to fast changes in the input voltage is not limited, or at least less limited, by internal limitations of the amplifier 200). This second benefit may be seen by noting that the compensation capacitor 106 of the conventional compensation scheme (shown in FIG. 1 and FIG. 2) always undergoes the full output-signal swing; the large-signal step response of the amplifier is therefore degraded by both the lower bandwidth and the limited slew rate. On the other hand, the compensation capacitor $C_c$ in FIG. 3 and FIG. 4 sees only the input signal swing, which is equal to the output swing divided by the closed loop gain. For example, assuming that the closed loop gain is set at 100 and a 40 mV step input is applied, the output is expected to have a 4 V step. In FIG. 1, the voltage across the compensation capacitor 106 has to change by 4 V. In FIG. 4, however, the voltage across the compensation capacitor $C_c$ only needs to change by 40 mV. With less "distance" to travel, the voltage swing across the compensation capacitor $C_c$ settles much faster, which means the amplifier output settles much faster under large signal step.

Figure 7:
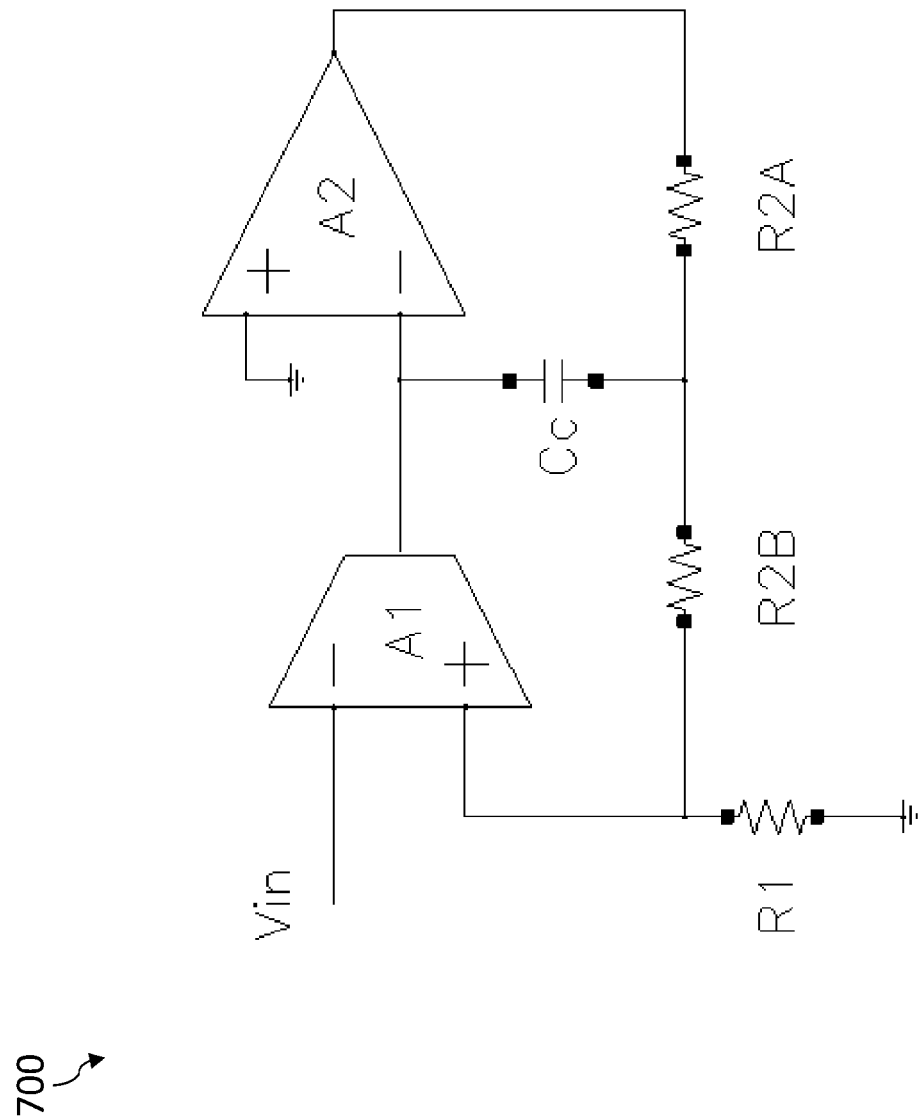
FIG. 7 is another embodiment of a feedback circuit for an amplifier in accordance with an embodiment of the invention.

Assuming the broadband noise is dominant, the total noise of an amplifier is approximately proportional to the square root of its bandwidth. Sometimes it is desirable to make a compromise between the total noise and closed-loop bandwidth, so that the bandwidth is just high enough to meet the requirement on settling time without introducing extra noise. FIG. 7 illustrates another embodiment 700 of the invention for this purpose. In FIG. 7, the feedback resistor $R_2$ is split into two components: $R_{2A}$ and $R_{2B}$, and $C_C$ is connected between an intermediate node of the amplifier and the intermediate node of R2. The bandwidth is thus extended by a factor of $$\frac{1+A_2}{1+\left(1+\frac{R_{2B}}{R_1}\right)A_2\beta}$$

Figure 8:
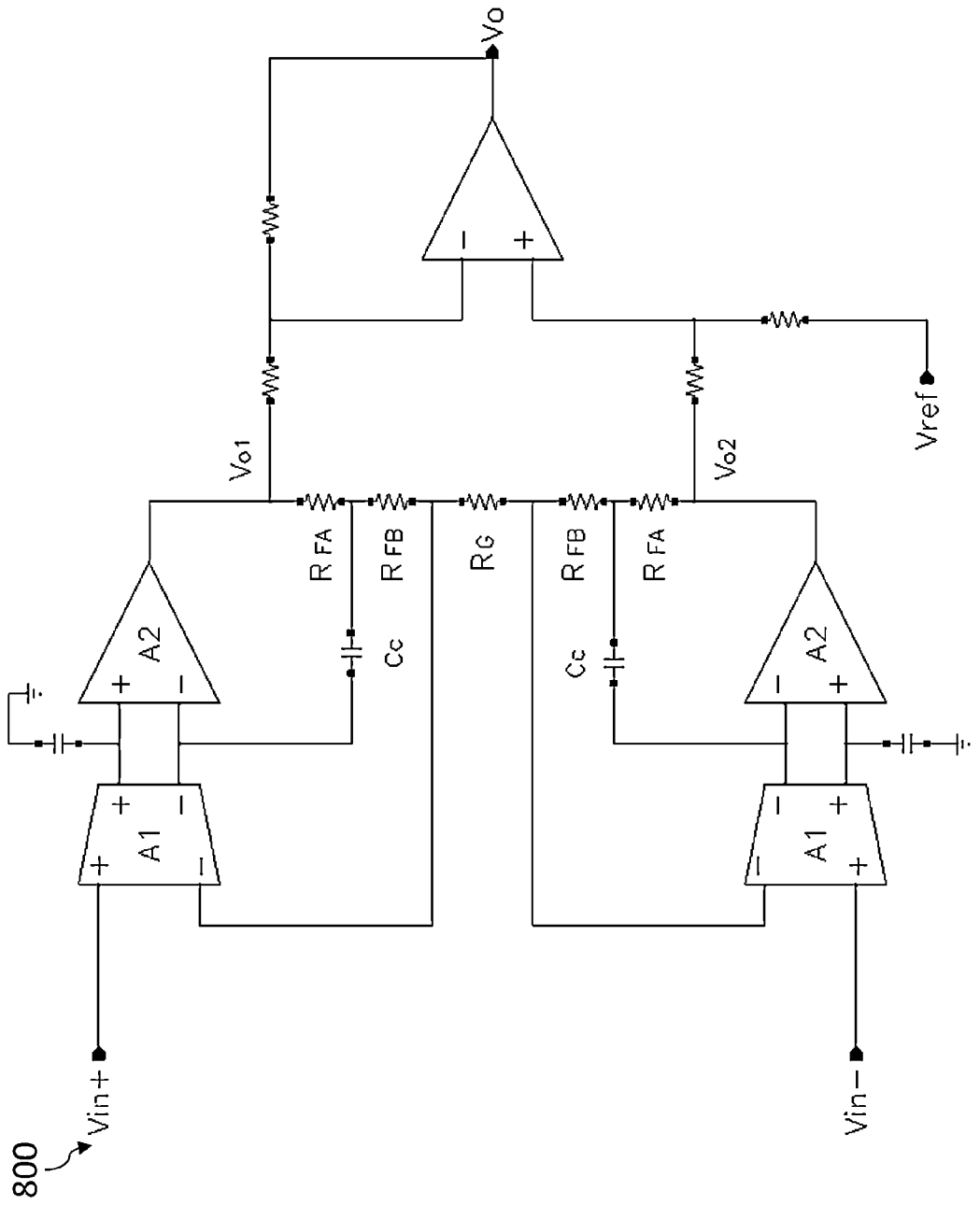
FIG. 8 illustrates another exemplary instrumentation amplifier in accordance with an embodiment of the invention.
Figure 9:
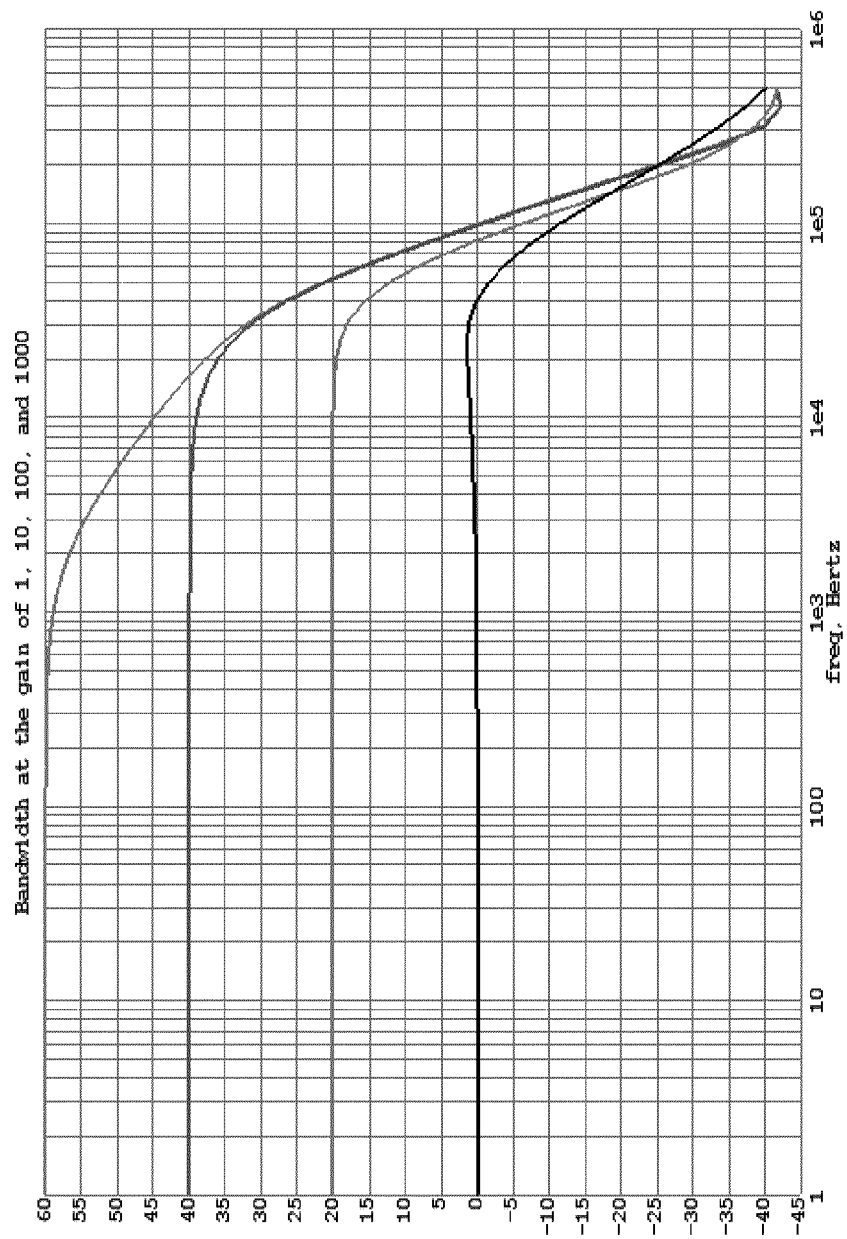
FIG. 9 is a graph of bandwidth values for a feedback circuit for an amplifier in accordance with an embodiment of the invention.
Figure 10:
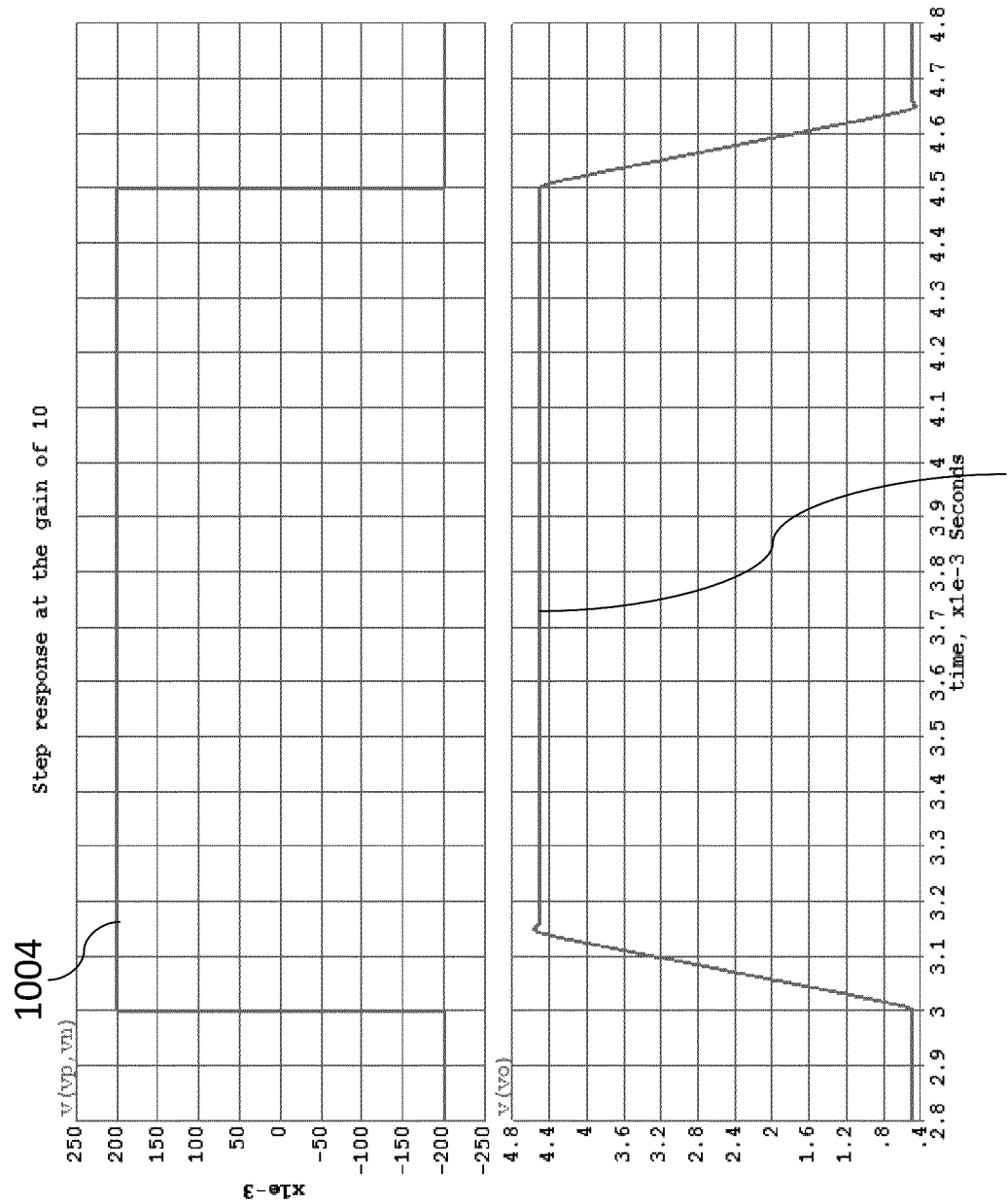
FIGS. 10 and 11 are graphs of step responses for feedback circuits in accordance with embodiments of the invention.
Figure 11:
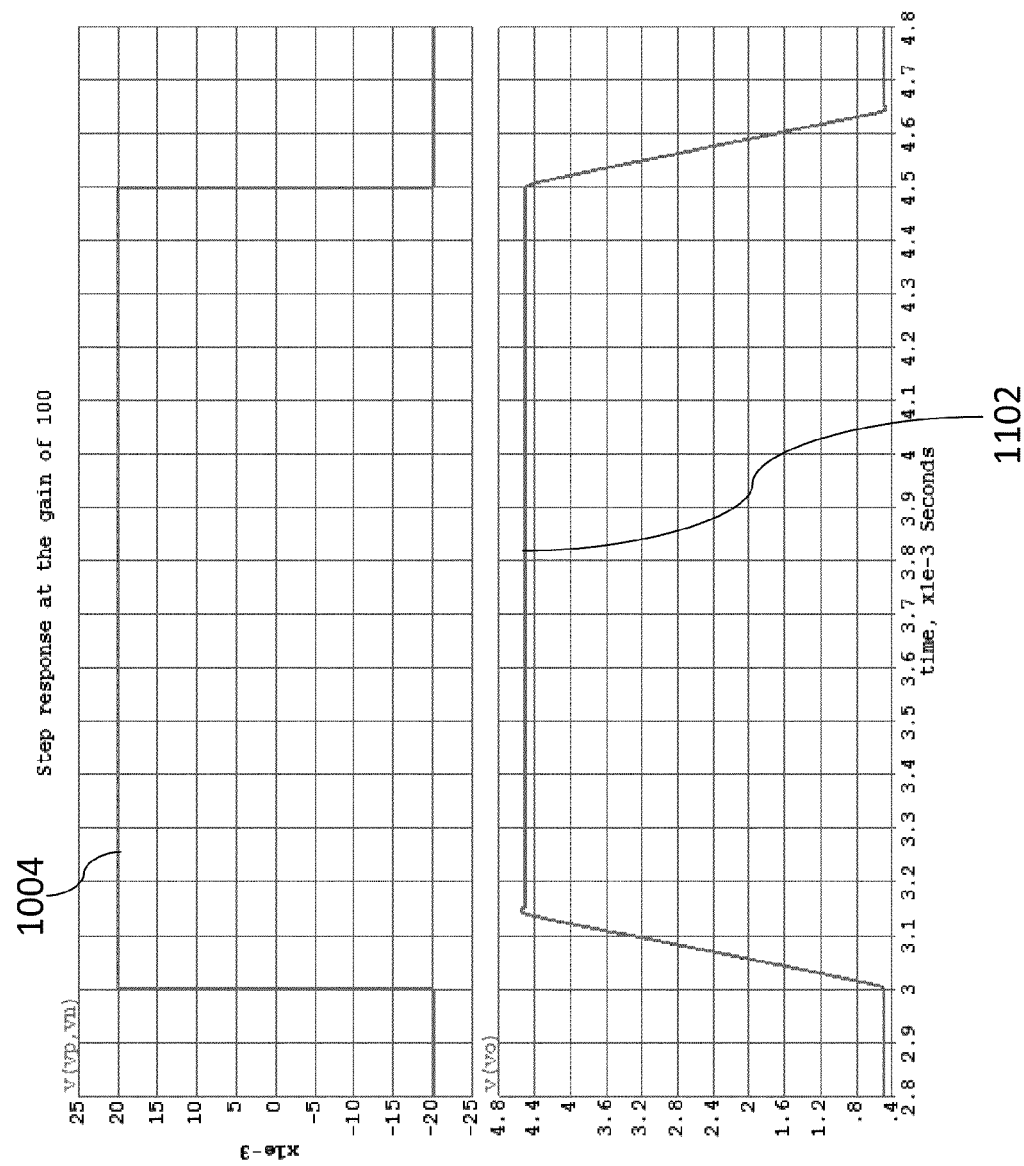

FIG. 8 illustrates an exemplary embodiment 800 of the invention disposed in a resistor-programmable ultra-low-power instrumentation amplifier. In this design, $R_F$ is split into two components: $R_{FA}$ (which may be, for example, 49 kΩ) and $R_{FB}$ (which may be, for example, 1 kΩ). By adjusting the ratio of $$\frac{R_{FA}}{R_{FB}},$$

a compromise between bandwidth and noise may be made to best suit specific applications. In this design, the bandwidth is extended to 15 kHz at a gain setting of 100; noise is suppressed beyond that frequency. The circuit's bandwidth-versus-gain settings are shown in FIG. 9. The bandwidth BW* at the gains of 1, 10, 100, and 1000 are approximately equal to 50 kHz, 35 kHz, 17 kHz, and 1.8 kHz respectively. The large-signal (e.g., 4 V) responses 1002, 1102 of a step input 1004 of the circuit 800 at gains of 10 and 100 are shown in FIGS. 10 and 11, respectively.

Figure 12:
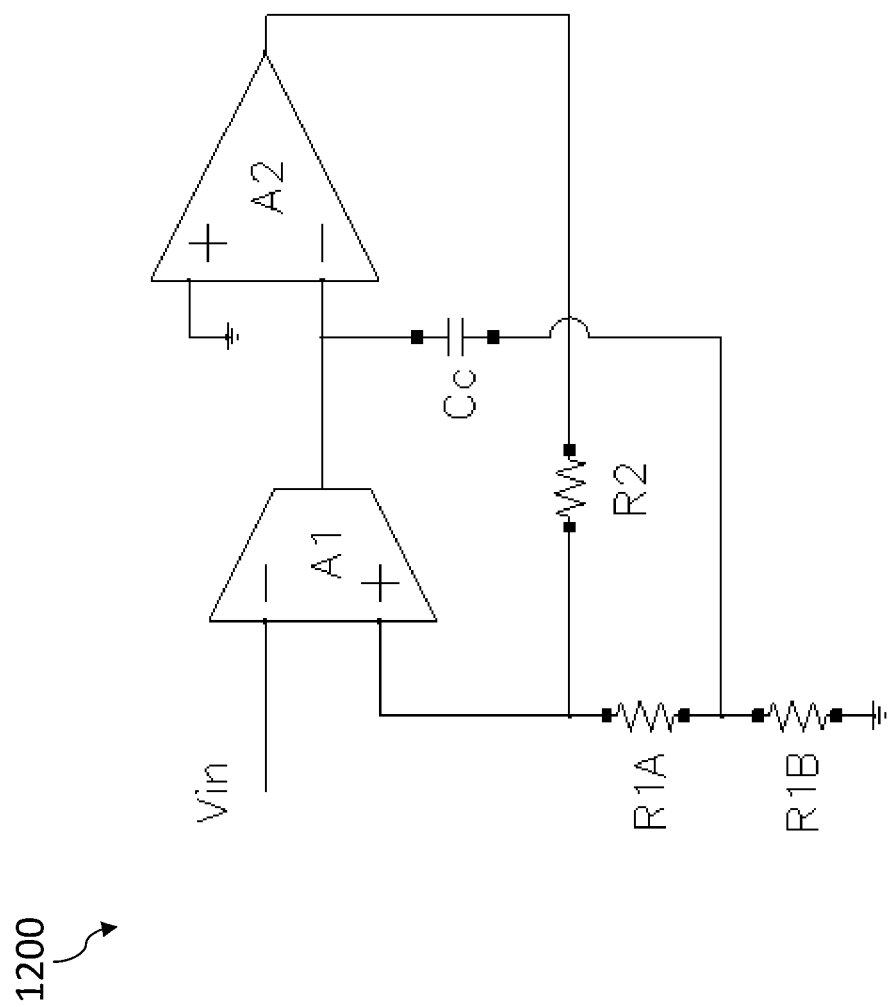
FIG. 12 is another embodiment of a feedback circuit for an amplifier in accordance with an embodiment of the invention.

In some applications, it may be required to extend the closed-loop bandwidth further. FIG. 12 illustrates another embodiment 1200 of the invention for this purpose. In FIG. 12, the feedback resistor $R_1$ is split into two components, $R_{1A}$ and $R_{1B}$, and $C_C$ is connected between an intermediate node of the amplifier and the intermediate node of $R_1$. The bandwidth in this embodiment is thus extended by a factor of $$\frac{1+A_2}{1+\frac{R_{1B}}{R_{1A}+R_{1B}}A_2\beta}$$

Figures 13A, 13B, 13C, 13D, 13E:
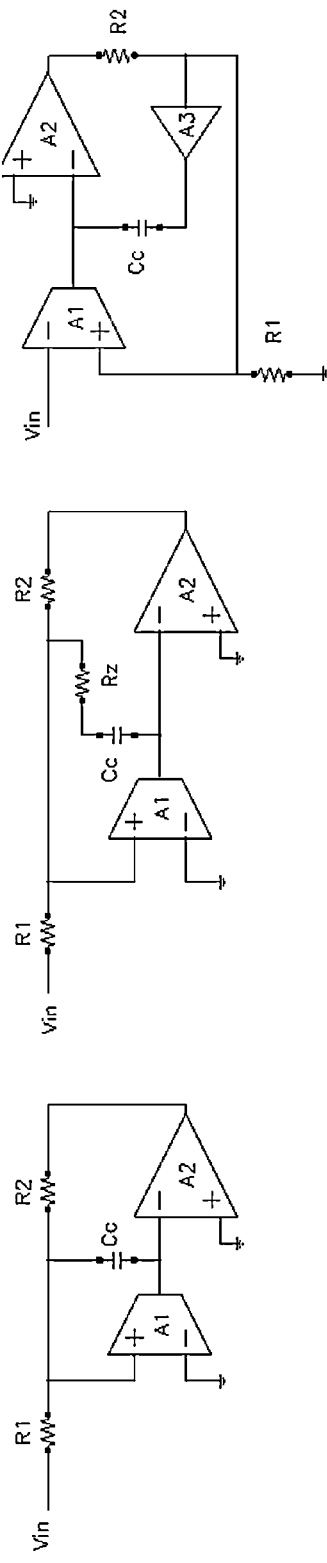
FIGS. 13A-13E illustrate exemplary embodiments of circuits implementing a self-adaptive compensation technique in accordance with embodiments of the invention.

FIGS. 13A-13E illustrate a variety of embodiments as examples; one of skill in the art will understand, however, that possible implementations are not limited to these embodiments. FIG. 13A shows an amplifier that may be configured as an inverting amplifier; FIG. 13B shows a resistor may be placed in series with the compensation capacitor to cancel a right half plane zero in transfer function. FIG. 13C shows an amplifier $A_3$ that may be placed in series with the compensation capacitor to cancel a right half plane zero in transfer function. $A_3$ may be a voltage follower, or may have some gain. FIG. 13D and FIG. 13E show that the invention may be applied to multiple-stage amplifiers in feedback operation.

Figure 14:
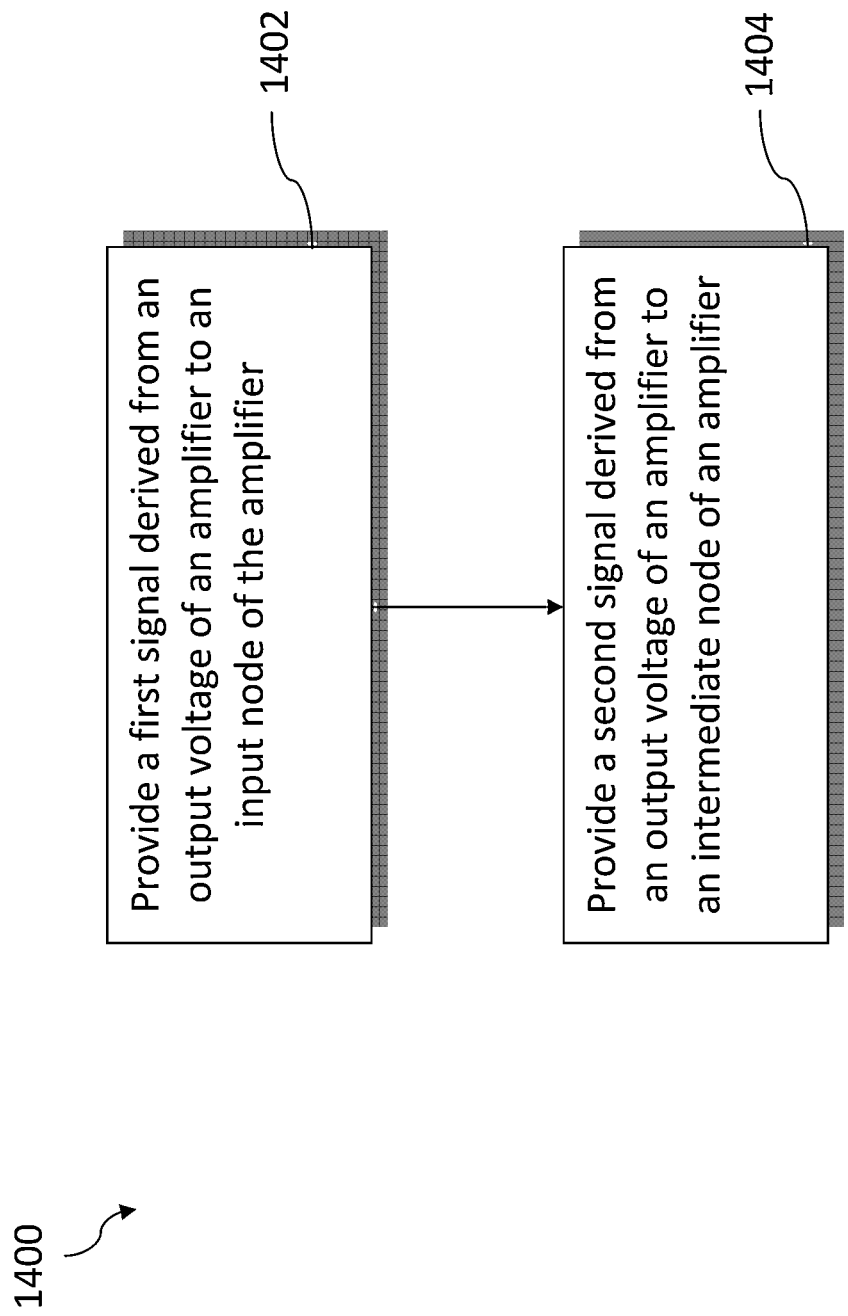
FIG. 14 illustrates a method for extending the bandwidth of an amplifier in accordance with an embodiment of the invention.

FIG. 14 illustrates a method 1400 for extending a bandwidth of a voltage-feedback amplifier. In a first step 1402, a first signal derived from an output voltage (e.g., Vo) of an amplifier is provided to an input node of the amplifier. In a second step 1404, a second signal derived from an output voltage (e.g., Vo) is provided to an intermediate node of the amplifier (e.g., the node 208). With such an arrangement, the second path provides a self-adaptive Miller compensation, i.e. the Miller effect is automatically reduced when the closed loop gain of the feedback amplifier is increased, which effectively increases the closed loop bandwidth while also eliminating/alleviating its slew limitation under a large-signal step response.

What is claimed is:
1. A system to extend a bandwidth and to improve slew behavior of a feedback amplifier, the system comprising:
   a first amplifier having an input node, an output node, and an intermediate node;
   a first feedback path between the input node and the output node; and
   a second feedback path between the intermediate node and the output node, the first feedback path sharing at least a portion of the second feedback path, wherein a closed-loop 3 dB bandwidth is extended by a factor of

$$\frac{1+A_2}{1+A_2\beta},$$

wherein β is the feedback coefficient of the first feedback path and $A_2$ is a gain between the intermediate node and the output node.

2. The system of claim 1, wherein the first feedback path and the second feedback path share a feedback resistor.

3. The system of claim 2, wherein the second feedback path comprises a compensation capacitor that is not shared with the first feedback path.

4. The system of claim 1, wherein the first feedback path comprises a feedback resistor split into two parts, and wherein the second feedback path shares one of the two parts of the feedback resistor of the first feedback path.

5. A system to extend a bandwidth and to improve slew behavior of a feedback amplifier, the system comprising:
an amplifier having an input node, an output node, and an intermediate node;
a first feedback path between the input node and the output node;
a second feedback path between the intermediate node and the output node, the first feedback path sharing at least a portion of the second feedback path; and
a resistor connected between the input node of the amplifier and a ground, the resistor split into two parts, wherein the second feedback path includes one of the two parts.

6. The system of claim 1, wherein the first amplifier comprises a multiple-stage amplifier.

7. The system of claim 1, wherein the closed-loop 3 dB bandwidth of the feedback amplifier remains approximately constant at a unity gain bandwidth of the first amplifier regardless of a gain setting of the feedback amplifier.

8. The system of claim 1, further comprising a second amplifier configured to amplify and/or to buffer a voltage on the output node.

9. The system of claim 1, further comprising a gain-setting resistor and a feedback resistor, wherein a signal derived from an output voltage of the first amplifier and a closed loop gain of the first amplifier depends on a ratio of the gain-setting resistor and the feedback resistor.

10. The system of claim 8, wherein the first amplifier and the second amplifier comprise an instrumentation amplifier.

11. The system of claim 8, wherein the second amplifier comprises a unity gain amplifier.

12. The system of claim 1, wherein the first amplifier is comprises a differential amplifier.

13. The system of claim 1, wherein the first amplifier comprises an operational amplifier.

14. The system of claim 1, wherein the first amplifier comprises a first stage configured to amplify an input voltage on the input node to produce an intermediate voltage on the intermediate node and a second stage configured to amplify the intermediate voltage to produce an output voltage on the output node.

15. A method to extend a bandwidth of a feedback amplifier, the method comprising:
providing a first signal derived from an output voltage of a first amplifier to an input node of the first amplifier; and
providing a second signal derived from the output voltage of the first amplifier to an intermediate node of the first amplifier, wherein the second signal increases a bandwidth of the feedback amplifier as a gain of the first amplifier increases, wherein a closed-loop 3 dB bandwidth is extended by a factor of $$\frac{1+A_2}{1+A_2\beta},$$

wherein β is the feedback coefficient and $A_2$ is a gain between the intermediate node and an output node of the first amplifier.

16. The method of claim 15, wherein providing the first signal comprises sharing an entire feedback resistor with the second signal.

17. The method of claim 15, wherein providing the first signal comprises sharing a portion of a feedback resistor with the second signal.

18. The method of claim 15, further comprising providing high input impedance in the first amplifier and a unity gain in a second amplifier.

19. The method of claim 15, further comprising adjusting a gain of the feedback amplifier.

20. The method of claim 19, wherein adjusting the gain of the feedback amplifier comprises adjusting a resistance of a gain-setting resistor.

21. A system to extend a bandwidth and to improve slew behavior of a feedback amplifier, the system comprising:
an amplifier having an input node, an output node, and an intermediate node;
a first feedback path for providing, to the input node, a first signal derived from an output voltage on the output node; and
a second feedback path for providing, to the intermediate node, a second signal derived from the output voltage on the output node, wherein a closed-loop 3 dB bandwidth is extended by a factor of $$\frac{1+A_2}{1+A_2\beta},$$

wherein β is the feedback coefficient of the first feedback path and $A_2$ is a gain between the intermediate node and the output node.

22. The system of claim 21, wherein the second feedback path comprises a compensation capacitor.

* * * * *

UNITED STATES PATENT AND TRADEMARK OFFICE
CERTIFICATE OF CORRECTION

PATENT NO. : 8,773,199 B2
APPLICATION NO. : 13/627117
DATED : July 8, 2014
INVENTOR(S) : Quan Wan It is certified that error appears in the above-identified patent and that said Letters Patent is hereby corrected as shown below:

In the Specification

In column 5 at lines 29-30 (approx.), Change "comnensation" to --compensation--.

In column 9 at line 56 (approx.), Change " $\dfrac{1+A_2}{1+\left(1+\dfrac{R_{2B}}{R_1}\right)A_2\beta}$ " to -- $\dfrac{1+A_2}{1+\left(1+\dfrac{R_{2B}}{R_1}\right)A_2\beta}$ --.

In column 10 at line 25 (approx.), Change " $\dfrac{1+A_2}{1+\dfrac{R_{1B}}{R_{1A}+R_{1B}}A_2\beta}$ " to -- $\dfrac{1+A_2}{1+\dfrac{R_{1B}}{R_{1A}+R_{1B}}A_2\beta}$ --.

In the Claims

In column 11 at line 50, In Claim 12, after "amplifier" delete "is".

Signed and Sealed this
Twenty-fourth Day of February, 2015

Michelle K. Lee
*Deputy Director of the United States Patent and Trademark Office*